US006597036B1

(12) United States Patent
Lee et al.

(10) Patent No.: US 6,597,036 B1
(45) Date of Patent: Jul. 22, 2003

(54) MULTI-VALUE SINGLE ELECTRON MEMORY USING DOUBLE-QUANTUM DOT AND DRIVING METHOD THEREOF

(75) Inventors: Jo-won Lee, Suwon (KR); Byong-man Kim, Gunpo (KR); Moon-kyung Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/692,620

(22) Filed: Oct. 20, 2000

(30) Foreign Application Priority Data

Apr. 15, 2000 (KR) ......................... 2000-19822

(51) Int. Cl.$^7$ ............................. H01L 29/788
(52) U.S. Cl. ................. 257/316; 257/315; 257/319; 257/317
(58) Field of Search ................. 257/314–317, 257/320–321, 324–326, 410–411, 14, 319

(56) References Cited

U.S. PATENT DOCUMENTS

| 5,600,163 A | 2/1997 | Yano et al. |
| 5,714,766 A | 2/1998 | Chen et al. |
| 5,801,401 A | 9/1998 | Forbes |
| 5,886,380 A | 3/1999 | Nakajima |
| 6,178,113 B1 * | 1/2001 | Gonzalez et al. ........... 257/316 |

FOREIGN PATENT DOCUMENTS

| JP | 06112479 A | * 4/1994 | ................. 257/316 |
| WO | 99/05724 | 2/1999 | |

OTHER PUBLICATIONS

C.D. Chen, et al., "Aluminum Single–Electron Nonvolatile Floating Gate Memory Cell," Appl. Phys. Lett. 74 (14), Oct. 6, 1997, pp. 2038–2040.
Y. Takahashi, et al., "Si Memory Device Operated With A Small Number Of Electrons By Using A Single–Electron–Transistor Detector," Electronics Letters, vol. 34, No.1, Jan. 8, 1998, pp. 45–46.

* cited by examiner

Primary Examiner—Minh Loan Tran
Assistant Examiner—Thomas L. Dickey
(74) Attorney, Agent, or Firm—Burns Doane Swecker & Mathis, LLP

(57) ABSTRACT

A multi-value single electron memory using a multi-quantum dot, in which the floating gates (FG) of a EEPROM or a flash memory are formed to act as two quantum dots, and the two quantum dots are applied to multi-value memories, and a driving method of the multi-value single electron memory, are provided. Thus, a multi-value memory can be realized using two quantum dots. Also, an ultra-highly integrated memory of 1 Tb or greater can be realized without encountering a physical limit such as a short channel effect (SCE) caused by scaling down MOSFETs, in contrast to other memories.

20 Claims, 4 Drawing Sheets

$W_e \leq L_D$
$W_{FG1} \leq W_C$
$W_{FG2} \leq W_C$

MULTI-VALUE SINGLE ELECTRON MEMORY USING DOUBLE-QUANTUM DOT AND DRIVING METHOD THEREOF

BACKGROUND OF THE INVENTION

1. Field of the Invention

The present invention relates to a multi-value single electron memory using a multi-quantum dot, in which a floating gate (FG) of a EEPROM or a flash memory is formed of two quantum dots, and the two quantum dots are applied to multi-value memories, and a driving method thereof.

2. Description of the Related Art

Floating gate (FG)-type flash memories, which are existing memories using single electron charging, have been studied by many researchers. Hitachi introduced a 128M SET flash memory which operates at room temperature (U.S. Pat. No. 5,600,163) at academic society early in 1998. IBM has U.S. Pat. Nos. 5,714,766 and 5,801,401 wherein an enormous number of nano crystals are formed on an existing FET channel, and the resultant structure is applied to a floating gate (FG). Fujitsu in U.S. Pat. No. 5,886,380 and Minnesota University in WO Pat. No. 9,905,724 introduced a non-volatile memory which operates at room temperature using the principle that a single electron can screen a channel by forming a nanometer-sized quantum dot on an FET channel and applying the quantum dot to an FG and setting the width of a channel to be smaller than the Debye screen length ($L_D$) of an electron. NEC in Appl.Phys.Lett Vol 71, p 2038, 1997, and NTT in Electron.Lett, Vol 34, p 45, 1998 introduced a memory which operates a single electron transistor as an electrometer which indirectly detects the presence of electrons to a precision of a single electron and thus determines whether electrons are stored in a floating gate (FG). However, the SET flash memory of Hitachi has critical drawbacks in that the operating voltage is very high, and nano crystals used for a floating gate and nano crystals applied as a channel cannot be arbitrarily controlled in contrast to other memories. The memory introduced by IBM causes fluctuations in $\Delta V th$ and temperature due to the difficulty in maintaining the sizes of nano crystals, which are applied as a floating gate, to be uniform. The basic concept of the memories introduced by Fujitsu and Minnesota University is realization of a flash SET memory using the effect of charging with a single electron by making the width of a channel equal to or smaller than the Debye screen length. However, the memories introduced by Fujitsu and Minnesota University have problems in that the retention time is less than 5 seconds since recording by direct tunneling increases leakage current. In order to increase the retention time, the thickness of a dielectric film $SiO_2$ used as a tunneling barrier must be increased, and accordingly, a writing method must be changed. Also, about 20 electrons other than one electron must be charged in a floating gate (FG). The memories introduced by Fujitsu and Minnesota University use one quantum dot. When the channel length is reduced to achieve high integration, the memories are subjected to short channel effect (SCE) due to the scale down of a general MOSFET, which makes ultra-high integration difficult. In particular, reproducible and uniform control of a floating gate to have a size of several manometers cannot be secured, and fluctuations in $\Delta V th$ are caused by the difficulty in accurately controlling the number of electrons with which a floating gate (FG) is charged. In the memories produced by NEC and NTT, the structure of elements and a fabrication process thereof are very complicated.

According to the results of analysis made on the characteristics and realizability of the memory devices to which the above-identified patent are directed a method of forming a floating gate of numerous nano crystals, which is proposed by IBM, that is, constitution of one bit using more than several tens of electrons, was estimated to provide excellent reliability. However, as set forth above, the memory proposed by IBM also cannot arbitrarily control the number of nano crystals, so that the memory proposed by Fujitsu and Minnesota University, which can arbitrarily control the number of nano crystals and applies one quantum dot, can be more preferable to the memory of IBM if several drawbacks are solved.

SUMMARY OF THE INVENTION

To solve the above problems, an objective of the present invention is to provide a multi-value single electron memory using a double quantum dot, in which the width of a channel is made smaller than a Debye screen length by controlling the impurity concentration of a substrate so that a single electron can artificially screen a channel, a multi-value function is provided by arranging two quantum dots on a source and a drain to overcome a limit in ultrahigh integration due to short channel effect (SCE), a writing technique is changed to a channel hot electron injection (CHEI) technique, and a memory capacity of 1 Tb or greater is obtained by charging quantum dots with different numbers of several tens of electrons, and a driving method thereof.

To achieve the above objective, the present invention provides a multi-value single electron memory using a double quantum dot, including: a channel region having a width which is equal to or less than the Debye screen length, on a semiconductor substrate; a source and a drain doped with different impurities to the impurities of the channel region, the source and the drain formed having the channel region between them; an insulating layer formed on the source, the drain and the channel region; first and second floating gates formed in the insulating layer on the source and the drain on both ends of the channel region to act as quantum dots; and a control gate formed on the insulating layer which covers the first and second floating gates.

In the present invention, the semiconductor substrate is a silicon substrate doped at a concentration of $10^{18}$–$10^{13}$/cm$^3$, and the two floating gates, which act as quantum dots, stores different amounts of electrons using a channel hot electron injection (CHEI) technique, and thus provides multi-value storage functions depending on the number of electrons stored in each quantum dot. The two floating gates can be charged with different amounts of electrons by applying a positive voltage amount to one of the source and drain and an identical negative voltage amount to the other and making the charge capacities of the floating gates different. Alternatively, the two floating gates can be charged with different amounts of electrons by applying a positive voltage amount to one of the source and drain and a different negative voltage amount to the other while equalizing the sizes of the floating gates.

Preferably, the width of the channel is set to be equal to or less than the Debye screen length which is determined by the concentration of impurities doped in the silicon substrate, so that a threshold voltage fluctuation in the channel is caused by charging with one electron.

Also, in the present invention, the insulating film is formed by depositing $SiO_2$, $Al_2O_3$, AlN, AlON or SiON to a thickness of 100 nm or less, and acts as a tunnel barrier. Alternatively, the insulating film is formed by depositing TiO$_2$/SiO$_2$, Ta$_2$O$_5$/SiO$_2$, SiON/SiO$_2$, AlON/SiO$_2$, AlN/SiO$_2$, or Al$_2$O$_3$/SiO$_2$ to a thickness of 100 nm or less, and acts as a tunnel barrier. Each of the first and second floating gates has a width which is equal to or smaller than the width of the channel, a thickness of 100nm or less, and a diameter of 10 nm or less. Furthermore, it is preferable that the width, thickness and diameter of the first and second floating gates are reduced due to electric field oxidation, and both ends of each of the quantum dots are shaped of a bird beak. The first and second floating gates are doped with n-type impurities using an implanter or a diffusion furnace. The insulating layer on the first and second floating gates is formed of SiO$_2$, Al$_2$O$_3$, AlN, AlON, SiON, TiO$_2$/SiO$_2$, Ta$_2$O$_5$/SiO$_2$, SiON/SiO$_2$, AlON/SiO$_2$, AlN/SiO$_2$, or Al$_2$O$_3$/Si$_2$ to a thickness of 100 nm or less. Preferably, the control gate is formed of at least one material selected from the group consisting of Al, W, Co, Ti and polysilicon. Here, a polysilicon control gate is doped with n-type impurities using an implanter or a diffusion furnace.

In order to achieve the above objective, the present invention provides another multi-value single electron memory using a double quantum dot, including: a channel region having a width which is equal to or less than the Debye screen length, on a semiconductor substrate; a source and a drain doped with different impurities to the impurities of the channel region, the source and the drain formed having the channel region between them; an insulating layer formed on the source, the drain and the channel region; first and second floating gates formed in the insulating layer on the source and the drain on both ends of the channel region to act as quantum dots; and a control gate formed on the insulating layer which covers the first and second floating gates, wherein memory cells are arrayed on the semiconductor substrate in a matrix, the control gates are arrayed in strips to form word lines, and the drain is connected to bit lines which arrayed in strips so as to cross the word lines.

In the present invention, the semiconductor substrate is a silicon substrate doped at a concentration of $10^{18}$–$10^{13}$/cm$^3$, and the two floating gates, which act as quantum dots, store different amounts of less than several tens of electrons and thus provide multi-value storage functions depending on the number of electrons stored in each quantum dot. Preferably, the width of the channel is set to be equal to or less than the Debye screen length which is determined by the concentration of impurities doped in the silicon substrate, so that a threshold voltage fluctuation in the channel is caused by charging with one electron.

Also, in the present invention, the insulating film is formed by depositing SiO$_2$, Al$_2$O$_3$, AlN, AlON or SiON to a thickness of 100 nm or less, and acts as a tunnel barrier. Alternatively, the insulating film is formed by depositing TiO$_2$/SiO$_2$, Ta$_2$O,/SiO$_2$, SiON/SiO$_2$, AlON/SiO$_2$, AlN/SiO$_2$, or Al$_2$O$_3$/SiO$_2$ to a thickness of 100 nm or less, and acts as a tunnel barrier. Each of the first and second floating gates has a width which is equal to or smaller than the width of the channel, a thickness of 100 nm or less, and a diameter of 10 nm or less. Furthermore, it is preferable that the width, thickness and diameter of the first and second floating gates are reduced due to electric field oxidation, and both ends of each of the quantum dots are shaped of a bird beak. Also, preferably, the first and second floating gates are doped with n-type impurities using an implanter or a diffusion furnace, and the insulating layer on the first and second floating gates is formed of SiO$_2$, Al$_2$O$_3$, AlN, AlON, SiON, TiO$_2$/SiO$_2$, Ta$_2$O/SiO$_2$, SiON/SiO$_2$, AlON/SiO$_2$, AlN/SiO$_2$, or Al$_2$O$_3$/SiO$_2$ to a thickness of 100 nm or less. It is preferable that the control gate is formed of at least one material selected from the group consisting of Al, W, Co, Ti and polysilicon. Here, a polysilicon control gate is doped with n-type impurities using an implanter or a diffusion furnace.

To achieve the above objective, the present invention provides a method of driving a multi-value single electron memory using a double quantum dot, the memory including: a channel region having a width which is equal to or less than the Debye screen length, on a semiconductor substrate; a source and a drain doped with different impurities to the impurities of the channel region, the source and the drain formed having the channel region between them; an insulating layer formed on the source, the drain and the channel region; first and second floating gates formed in the insulating layer on the source and the drain on both ends of the channel region to act as quantum dots; and a control gate formed on the insulating layer which covers the first and second floating gates, wherein memory cells are arrayed on the semiconductor substrate in a matrix, the control gates are arrayed in strips to form word lines, and the drain is connected to bit lines which arrayed in strips so as to cross the word lines. This method includes performing writing by charging the second floating gate FG2 with a predetermined number of electrons in consideration of a channel hot electron injection (CHEI) technique by applying a source-drain voltage Vds of less than 12 Volts and a control gate voltage Vg of less than 15 Volts to a selected memory cell, or by charging another selected memory cell with a different number of electrons to the number of electrons charged in the second floating gate by applying a source-drain voltage Vds of less than −12 Volts and a control gate voltage Vg of less than 15 Volts to the other selected memory cell. Also, this method includes performing erasing by slipping the electrons charged in the writing step from the second floating gate and going into the control gate by opening the source-drain voltage Vds and applying a control gate voltage Vg of about 15 Volts to the second floating gate, using a Fowler-Nordheim (F-N) tunneling method. Furthermore, the method includes reading written information by detecting current values of the selected cells by applying a drain-source voltage Vds of less than 5 Volts to a cell selected to read out, and applying the middle value of the threshold voltage Vth of the first floating gate FG1 and the threshold voltage Vth of the second floating gate FG2 selected as a control gate voltage Vg to the selected cell.

BRIEF DESCRIPTION OF THE DRAWINGS

The above objective and advantage of the present invention will become more apparent by describing in detail preferred embodiments thereof with reference to the attached drawings in which:

FIG. 2B-1 is a top, plan view of the method step shown in FIG. 2B;

DESCRIPTION OF THE PREFERRED EMBODIMENT

The objective of the present invention is to realize an ultra highly-integrated memory with a memory capacity of 1 Tb or greater by overcoming the drawbacks of a memory device proposed by Fujitsu and Minnesota University. Accordingly, like the memory fabricated by Fujitsu and Minnesota University, a channel width is made smaller than a Debye screen length by controlling the impurity concentration of a substrate so that a single electron screens a channel. Thereafter, a multi-value function is provided by arranging two quantum dots on a source and a drain in order to overcome a limit in ultrahigh integration due to a short channel effect (SCE). When a writing method is improved from a direct method to a channel hot electron injection (CHEI) method in order to set the number of electrons charging the quantum dots to several tens of electrons, an ultra highly-integrated memory with a memory capacity of 1 Tb or greater can be realized, and a memory according to the present invention acts as a memory which consumes an extremely small amount of power.

The memory according to the present invention is a non-volatile memory which consumes an extremely small amount of power since electrons can be stored in a floating gate (FG) one by one by applying the charging effect of a single electron, and a single electron can screen a channel. Also, a short channel effect (SCE), that may be caused during high integration, is not generated by the application of two quantum dots to an FG, so that ultrahigh integration of 1 Tb or greater can be achieved, and that the memory according to the present invention can be realized at high speed in units of nsec. A multi-value single electron memory using two quantum dots, having these advantages, is configured as shown in FIG. 1.

Figure 1:
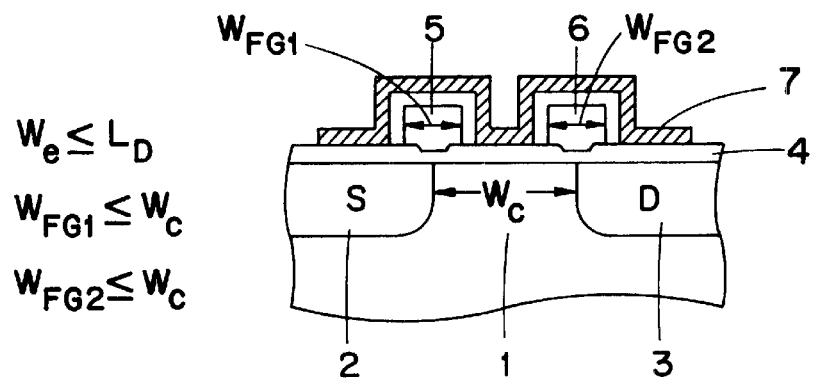
FIG. 1 is a vertical cross-sectional view schematically illustrating the configuration of a multi-value single electron memory using double quantum dot according to the present invention.

FIG. 1 is a vertical cross-sectional view schematically illustrating the configuration of a multi-value single electron memory using two quantum dots according to the present invention. As shown in FIG. 1, the multi-value single electron memory using two quantum dots according to the present invention fundamentally has a structure in which a source 2 and a drain 3 are formed in a semiconductor substrate by doping both sides of a channel 1 with impurities. A dielectric layer 4 is formed on the upper surface of the resultant structure. Two floating gates 5 and 6 are formed on the dielectric layer 4 on the channel 1, and the exterior surfaces of the floating gates 5 and 6 are covered with a dielectric layer. A control gate 7 is formed on the dielectric layer 4 on the upper surfaces of the floating gates 5 and 6.

Figure 2A:
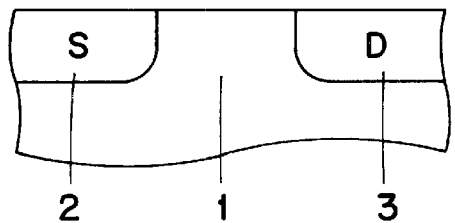
FIGS. 2A through 2C are vertical cross-sectional views illustrating a method of fabricating the multi-value single electron memory using double quantum dot of FIG. 1.

In the manufacture of a multi-value single electron memory using a double quantum dot having such a configuration, first, as shown in FIG. 2A, a source 1 and a drain 2 are formed on a semiconductor (silicon) substrate having a channel 1 therebetween, by doping the semiconductor substrate with impurities, thereby fabricating the basic structure of an FET. Here, the impurity concentration of the Si substrate is $10^{13}$ to $10^{13} cm^3$, and the width of the channel is made equal to or smaller than a Debye screen length $L_D$ by determining the Debye screen length $L_D$ according to the impurity concentration of the substrate.

Figure 2B:
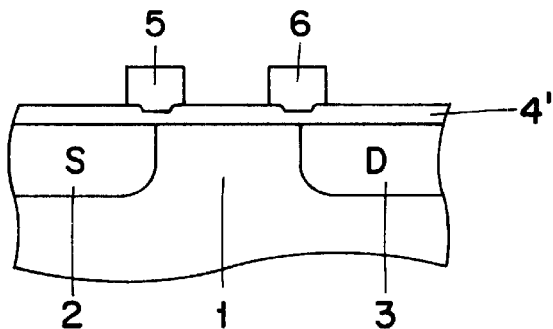

Next, as shown in FIG. 2B, the basic structure of an FET is covered with a dielectric film 4', and floating gates 5 and 6, which act as two quantum dots, are formed on the dielectric film 4' on the channel 1, the source 2 and the drain 3. That is, the dielectric film 4' is formed by depositing $SiO_2$, $Al_2O_3$, AlN, AlON, SiON, $TiO_2/SiO_2$, $Ta_2O_5/SiO_2$, $SiON/SiO_2$, $AlON/SiO_2$, $AlN/SiO_2$, or $Al_2O_3/SiO_2$ on the channel 1, the source 2 and the drain 3 to a thickness of 10 nm or less by physical vapor deposition (PVD) or chemical vapor deposition (CVD). The dielectric film 4' is applied as a tunnel barrier. Thereafter, two quantum dots 5 and 6 are formed on the $SiO_2$ barrier to serve as two floating gates FG.

In a method of forming the two floating gates, first, polycrystalline Si is deposited on the dielectric film 4' by CVD or PVD. Then, as shown in FIG. 2B, two FGs 5 and 6 are formed on a source (drain) side and on a drain (source) side, respectively, by photolithography or E-beam lithography and etching. Here, the width of each FG (i.e. $W_{FG1}$ and $W_{FG2}$) is smaller than or equal to the width of a channel $W_C$, and the thickness thereof is 100 nm or less. A different number of electrons can be charged in each floating gate by making the sizes of the floating gates different (which corresponds to the case that the sizes of the two floating gates are made different so that a different number of saturation electrons are charged at the same drain-source voltage Vds), or by applying a different amount of drain-source voltage Vds to each floating gate while equalizing the sizes of the two floating gates (which corresponds to the case that the number of saturation electrons charged in each floating gate is identical at the same drain-source voltage Vds, but two different amounts of voltage Vds, which are less than the saturation charge voltage of the two floating gates, are applied to the two floating gates). Thereafter, the two floating gates FGs 5 and 6 are doped with n-type impurities using an implanter or a diffusion furnace, so that the conductivity type of the two floating gates FGs 5 and 6 is an n-type. The sizes of the floating gates FGs 5 and 6 can be further reduced by field oxidation. At this time, both ends of a quantum dot are shaped of a bird beak as shown in FIG. 2B.

Figure 2C:
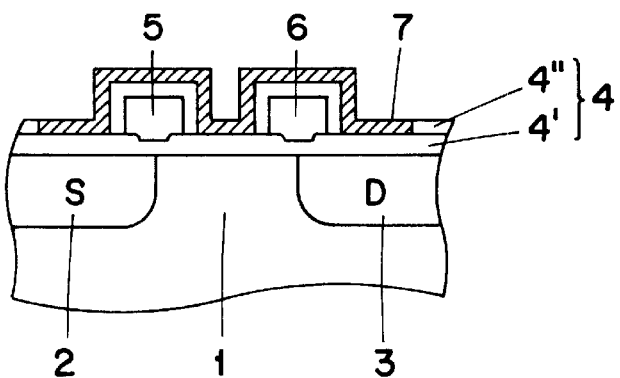
Figures 1, 2B:
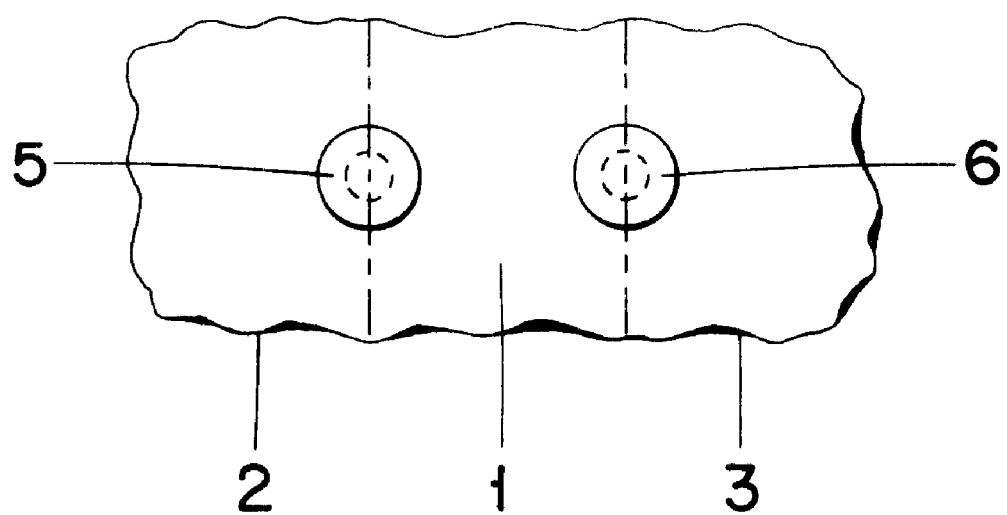

Next, as shown in FIG. 2C, the exposed surfaces of the two quantum dots are coated with a dielectric film, and then a control gate 7 is formed. That is, a dielectric film 4" is formed of $SiO_2$, $Al_2O_3$, AlN, AlON, SiON, $TiO_2/SiO_2$, $Ta_2O_5/SiO_2$, $SiON/SiO_2$, $AlON/SiO_2$, $AlN/SiO_2$, or $Al_2O_3/SiO_2$ to a thickness of 100 nm or less on two quantum dots by PVD or CVD. The control gate 7 is formed of Al, W, Co, Ti or polysilicon by CVD or PVD. Then, the resultant structure is coated with resist, and then the shape of the control gate 7 shown in FIG. 2C is completed by E-beam lithography or photolithography and etching. When the control gate is formed of polysilicon, it is doped with n-type impurities using an implanter or a diffusion furnace, thus becoming an n-type control gate.

The principle of the operation of the multi-value memory using double quantum dots manufactured by the above-described method will now be described.

First, the Debye screen length is expressed as in by the following equation 1:

$$L_D = (\epsilon k_B T / q^2 N_A)^{1/2} \qquad (1)$$

wherein $\epsilon$ denotes the dielectric constant of the substrate, $k_B$ denotes Boltzmann's constant, T denotes the absolute temperature, q denotes the charge, and $N_A$ denotes the concentration of impurities in the substrate. The following Table 1 shows the Debye screen length according to $N_A$.

TABLE 1

| Concentration of impurities in substrate ($N_A$); cm$^{-3}$ | Debye screen length ($L_D$); nm |
|---|---|
| 4 × 10$^{18}$ | 2 |
| 10$^{16}$ | 42 |
| 10$^{15}$ | 130 |
| 10$^{14}$ | 420 |
| 10$^{13}$ | 1300 |

It can be seen from Table 1 that the screening length of an electron can be controlled by varying the concentration of impurities in a substrate. Hence, assuming that $L_D$ is 100 nm, when the impurity concentration of a substrate is set within a range of 10$^{15}$ to 10$^{16}$ CM$^{-3}$, the width of a channel in this case can be set to be 100 nm or narrower. When a single electron is stored in a floating gate (FG) using a charging effect after the channel width has been set as described above, the single electron screens the channel, causing a threshold voltage variation $\Delta V_{th}$ as expressed in the following Equation 2:

$$\Delta th = nq/C_{gf} + C_{gc} \quad (2)$$

wherein n denotes the number of electrons charged in a floating gate (FG), q denotes electron charge, $C_{gf}$ denotes a capacitance applied to an FG and a control gate (CG), and $C_{gc}$ denotes a capacitance between the control gate (CG) and a channel. If the length and width of a channel are 200 nm and 100 nm, respectively, and a 50 nm-thick dielectric film SiO$_2$ is formed between the control gate (CG) and the channel, the threshold voltage variation $\Delta th$ caused by charging of a floating gate FG with one electron reaches 0.1 Volts. A device adopting the charging effect of a single electron can control the number of electrons charged. Accordingly, if 20 electrons are charged, the threshold voltage variation $\Delta V_{th}$ becomes 2 Volts, so that the sub-threshold current can be reduced several hundreds of thousands of times. For reference, the memory introduced by Fujitsu and Princeton University obtains a threshold voltage variation $\Delta V_{th}$ of about 0.1 Volts.

In order for a floating gate to be charged with one electron existing in a channel, the electron must be charged without thermal fluctuation. Accordingly, a temperature capable of controlling one electron varies with the size of the floating gate, as shown in the following Equation 3:

$$q^2/2C_{tt} \gg K_B T \quad (3)$$

Since $K_B T/q$ at room temperature is 0.026 eV, if the diameter of a quantum dot used as a floating gate (FG) is within 10 nm, electrons can be controlled individually at room temperature according to calculation.

The basic concept of the memories introduced by Fujitsu and Princeton University is realization of a SET flash memory using the effect of charging with one electron by reducing the width of a channel to the Debye screen length or narrower. However, the memories introduced by Fujitsu and Minnesota University have problems in that the information retention time is less than 5 seconds since recording by direct tunneling increases leakage current. In order to increase the retention time, the thickness of a dielectric film SiO$_2$ used as a tunneling barrier must be increased, and accordingly, a writing method must be changed. Also, about 20 electrons other than one electron must be charged in a floating gate (FG). If the thickness of the dielectric film SiO$_2$ is set to be 5 nm or greater, it corresponds to the range where F-N tunneling occurs, so that a channel hot electron injection (CHEI) method is considered as a method of charging with electrons.

Figure 3:
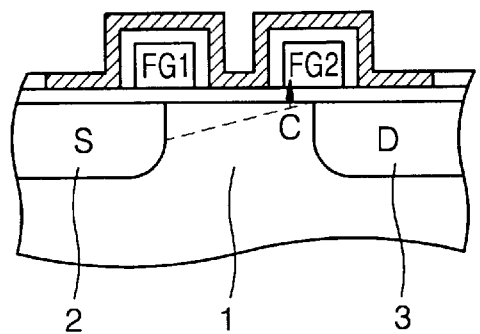
FIG. 3 is a cross-sectional view illustrating a method of performing writing using a second floating gate in the multi-value single electron memory using double quantum dot of FIG. 1.

A reading/writing/erasing method will now be described. First, a writing method is to charge the second floating gate FG2 of a selected memory cell with less than 20 electrons in consideration of the CHEI method by applying a source-drain voltage Vds of less than 12 Volts and a control gate voltage of less than 15 Volts to the second floating gate FG2, as shown in FIG. 3.

An erasing method is performed by F-N tunneling, so that electrons are slipped out of the bird beak portion of a quantum dot FG2 and go into a control gate CG by opening a source-drain voltage and applying a control gate voltage Vg of about 15 Volts to the quantum dot FG2.

Figure 4:
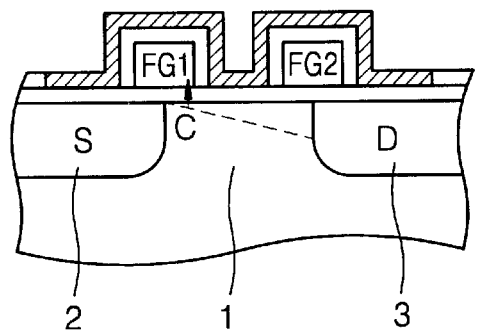
FIG. 4 is a cross-sectional view illustrating a method of performing writing using a first floating gate in the multi-value single electron memory using double quantum dot of FIG. 1.

As for writing to the first floating gate FG1, as shown in FIG. 4, another selected memory cell is charged with electrons by applying a source-drain voltage Vds of less than −12 Volts and a control gate voltage Vg of less than 15 Volts to the selected memory cell, or the selected memory cell is charged with electrons, the number of which is different to that for the second floating gate FG2.

In this embodiment, the second floating gate FG2 is charged with a greater number of electrons than the first floating gate FG1 is, in order to make the Vth variations of the FG1 and FG2 different, thereby performing reading. Different amounts of electrons can be charged in the FG1 and FG2 by making the sizes of the two floating gates different or by applying different amounts of drain-source voltage Vds to the two floating gates while equalizing the sizes of the two floating gates.

Figure 5:
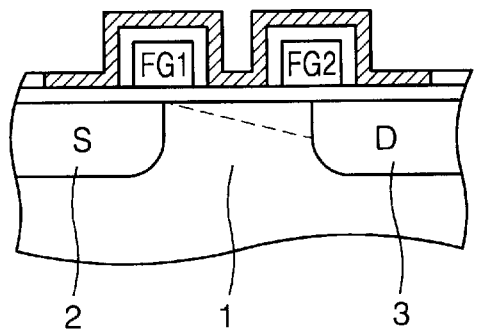
FIG. 5 is a cross-sectional view illustrating the multi-value single electron memory using double quantum dots of FIG. 1 to which data is not written.

Still another memory cell remains uncharged as shown in FIG. 5. Multi-values 0, 1 and 2 can be allocated to the thus-written cells.

Figure 6:
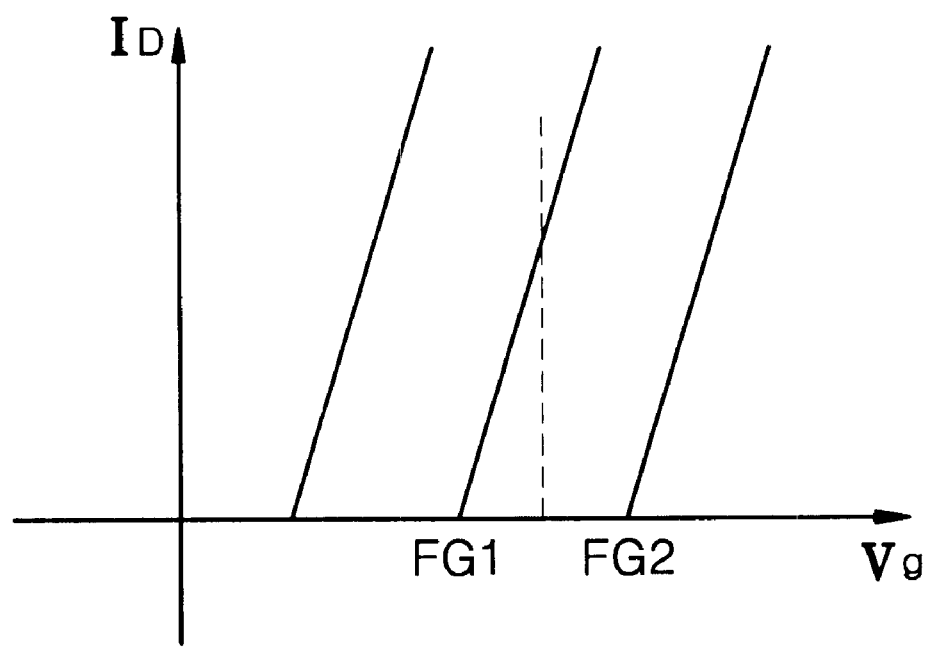
FIG. 6 is a graph showing drain current with respect to control gate voltage in the case of the multi-value single electron memory using double quantum dot of FIG. 1 to which no data is written, the case of the multi-value single electron memory using double quantum dot of FIG. 1 to which data is written using the first floating gate, and the case of the multi-value single electron memory using double quantum dot of FIG. 1 to which data is written using the second floating gate.

When a source-drain voltage Vds of less than 5 Volts is applied to read each of these cells, and the middle value of the Vth of the first floating gate FG1 and the Vth of the second floating gate FG2 is selected as a control gate voltage Vg as shown in FIG. 6, three current values of each cell can be detected simultaneously, so that a multi-value memory can be realized.

In the writing/reading/erasing operation, a multi-value single electron memory using a double quantum dot according to the present invention can maintain different digital information with less than several thousands of electrons, and thus can greatly reduce power consumption. That is, the power consumption P is expressed as in the following Equation 4:

$$P = cv^2 f = Qvf = nqvf \quad (4)$$

wherein c denotes a capacitance, v denotes operation voltage, f denotes frequency, Q denotes charge, n denotes the number of electrons, and q denotes the charge of an electron. As can be seen from Equation 4, the multi-value memory using a double quantum dot according to the present invention requires electrons, the number of which is smaller by several thousands of times than the number of electrons required by existing NVROMs, to preserve the memory function. Accordingly, it finds by simple calculation that the power consumption required to maintain a digital 0 can be reduced several thousands of times per cell. Consequently, there are no problems caused by heat generated by the operation of the memory. Thus, the multi-value memory using a double quantum dot according to the present invention does not have any of the thermal problems occur during high integration of NVROMs, so that integration up to the range of Terabits (Tb) is possible.

As described above, the single electron memory using two quantum dots according to the present invention has a structure in which a floating gate is formed on each end of the surface of a channel, an insulating layer is formed on the floating gates, and a control gate is formed on the insulating layer. Thus, a multi-value memory using two quantum dots can be realized, and an ultra-highly integrated memory of 1 Tb or greater can be realized without encountering a physical limit such as SCE caused by scaling a MOSFET, in contrast to other memories. General NVROMs (flash memories, EEPROMs and EPROMs) must store several tens of thousands of electrons in a floating gate FG to represent various digital information. However, the memory according to the present invention can maintain various digital information with less than several tens of electrons, and thus can greatly reduce power consumption. Consequently, there are no problems caused by heat generated by the operation of the memory. Thus, the memory according to the present invention does not have any of the thermal problems which occur during high integration of NVROMs, so that integration up to the range of Terabits (Tb) is possible.

Also, the memory according to the present invention is operated by less than several tens of electrons, and so can drastically shorten the writing and erasing time, compared to existing NVROMs. Thus, a fast operation on the order of nsec is possible. Furthermore, the memory according to the present invention does not require wiring cutting for preventing electromigration, since the number of electrons flowing on a wire is less than that in existing NVROMs. Also, the memory according to the present invention has no degradation of a tunnel insulating film since different amounts of electrons are charged in two quantum dots using the CHEI and the effect of charging with a single electron. Therefore, the present invention is applicable to ultra highly integrated flash memories, ultra highly integrated EEPROMs and EPROMs, DRAMs, SRAMs and others.

What is claimed is:

1. A multi-value single electron memory using a double quantum dot, comprising:
    a channel region having a width which is equal to or less than the Debye screen length, on a semiconductor substrate;
    a source and a drain doped with different impurities relative to impurities of the channel region, the source and the drain having the channel region between them;
    an insulating layer formed on the source, the drain and the channel region;
    first and second floating gates formed in the insulating layer on the source and the drain at respective ends of the channel region which act as quantum dots; and
    a control gate formed on the insulating layer which covers the first and second floating gates,
    wherein each of the first and second floating gates has a width which is equal to or smaller than the width of the channel, a thickness of 100 nm or less, and a diameter of 10 nm or less; and
    wherein the width, thickness and diameter of the first and second floating gates are reduced due to dielectric field oxidation, and both ends of each of the quantum dots are in the shape of a bird beak.

2. The multi-value single electron memory using a double quantuin dot of claim 1, wherein the semiconductor substrate is a silicon substrate doped at a concentration of $10^{18}$–$10^{13}$/cm$^3$.

3. The multi-value single electron memory using a double quantum dot of claim 1, wherein the two floating gates, which act as quad dots, are charged with different numbers of electron charges by making the sizes of the floating gates different or by applying different amounts of drain-source voltage Vds to the two floating gates while equalizing the sizes of the floating gates, thereby providing multi-value storage functions depending on the number of electrons stored in each quantum dot.

4. The multi-value single electron memory using a double quantum dot of claim 1, wherein the width of the channel is set to be equal to or less than the Debye screen length which is determined by the concentration of impurities doped in the silicon substrate, so that a threshold voltage fluctuation in the channel is caused by charging with one electron.

5. The multi-value single electron memory using a double quantum dot of claim wherein the insulating film is one material selected from a group consisting of $SiO_2$, $Al_2O_3$, AlN, AlON or SiON at a thickness of 100 mm or less, and acts as a tunnel barrier.

6. The multi-value single electron memory using a double quantun dot of claim 1, wherein the insulating film is one material selected from a group consisting of $TiO_2$, $Ta_2O_5$, SiON, AlON, AlN, $Al_2O_3$ each either alone or in combination with $SiO_2$, and $SiO_2$.

7. The multi-value single electron memory using a double quantum dot of claim 1, wherein the insulating layer on the first and second floating gates is deposited to a thickness of 100 nm or less.

8. The multi-value single electron memory using a double quantum dot of claim 1, wherein the control gate is formed of at least one material selected from the group consisting of Al, W, Co, Ti and polysilicon.

9. The multi-value single electron memory using a double quantum dot of claim 8, wherein the control gate formed of polysilicon is doped with n-type impurities using an implanter or a diffusion furnace.

10. A memory device comprising a plurality of memory cells, each memory cell including a multi-value single electron memory using a double quantum dot, said multi-value angle electron memory comprising:
    a channel region having a width which is equal to or less than the Debye screen length, on a semiconductor substrate;
    a source and a drain doped with different impurities relative to impurities of the channel region, the source and the drain having the channel region between them;
    an insulating layer formed on the source, the drain and the channel region;
    first and second floating gates formed in the insulating layer on the source and the drain at respective ends of the channel region which act as quantum dots; and
    a control gate formed on the insulating layer which covers the first and second floating gates,
    wherein said plurality of memory cells are arrayed on the semiconductor substrate in a matrix, the control gates are arrayed in strips to form word lines, and the drain is connected to bit lines which arrayed in strips so as to cross the word lines;
    wherein each of the first and second floating gates has a width which is equal to or smaller than the width of the channel, a thickness of 100 nm or less, and a diameter of 10 nm or less; and
    wherein the width, thickness and diameter of the first and second floating gates are reduced due to dielectric field oxidation, and both ends of each of the quantum dots are in the shape of a bird beak.

11. The memory device of claim 10, wherein the semiconductor substrate is a silicon substrate doped at a concentration of $10^{18}$–$10^{13}$cm$^3$.

12. The memory device of claim 10, wherein the two floating gates, which act as quantum dots, are charged with different amounts of electrons by making the sizes of the floating gates different or by applying different amounts of drain-source voltage Vds to the two floating gates while equalizing the sizes of the floating gates, thereby providing multi-value storage functions depending on the number of electrons stored in each quantum dot.

13. The memory device of claim 10, wherein the width of the channel is set to be equal to or less than the Debye screen length which is determined by the concentration of impurities doped in the silicon substrate, so that a threshold voltage fluctuation in the channel is caused by charging with one electron.

14. The memory device of claim 10, wherein the insulating film is one mat selected from a group consisting of SiO$_2$, Al$_2$O$_3$, AlN, AlON or SiON at a thickness of 100 nm or less, and acts as a tunnel barrier.

15. The memory device of claim 10, wherein the insulating film is one material selected from the group consisting of TiO$_2$, Ta$_2$O$_5$, SiON, AlON, AlN, Al$_2$O$_3$ each either alone or in combination with SiO$_2$, and SiO$_2$.

16. The memory device of claim 10, wherein the insulating layer on the first and second floating gates is deposited to a thickness of 100 nm or less.

17. The memory device of claim 16, wherein the insulating film is formed of SiO$_2$, Al$_2$O$_3$, AlN, AlON, SiON, and one of TiO$_2$, Ta$_2$O$_5$, SiON, AlON, AlN, Al$_2$O$_3$ each either alone or in combination with SiO$_2$.

18. The memory device of claim 10, wherein the control gate is formed of at least one material selected from the group consisting of Al, W, Co, Ti and polysilicon.

19. The memory device of claim 18, wherein the control gate formed of polysilicon is doped with n-type impurities using an implanter or a diffusion furnace.

20. The multi-value single electron memory using a double quantum dot of claim 7, wherein the insulating film is one material selected from a group consisting of SiO$_2$, Al$_2$O$_3$, AlN, AlON, SiON, and one of TiO$_2$, Ta$_2$O$_5$, SiON, AlON, AlN, and Al$_2$O$_3$ each either alone or in combination with SiO$_2$.

* * * * *